US009953689B2

(12) United States Patent
Kwon et al.

(10) Patent No.: US 9,953,689 B2
(45) Date of Patent: Apr. 24, 2018

(54) MEMORY DEVICE, RELATED METHOD, AND RELATED ELECTRONIC DEVICE

(71) Applicant: Semiconductor Manufacturing International (Shanghai) Corporation, Shanghai (CN)

(72) Inventors: Yi Jin Kwon, Shanghai (CN); Hao Ni, Shanghai (CN); Hong Yu, Shanghai (CN); Chuntian Yu, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 15/393,023

(22) Filed: Dec. 28, 2016

(65) Prior Publication Data

US 2017/0110167 A1    Apr. 20, 2017

Related U.S. Application Data

(62) Division of application No. 14/943,626, filed on Nov. 17, 2015, now Pat. No. 9,570,115.

(30) Foreign Application Priority Data

Dec. 8, 2014    (CN) .......................... 2014 1 0743255

(51) Int. Cl.
*G11C 7/10*    (2006.01)
*G11C 7/22*    (2006.01)
*G11C 5/06*    (2006.01)
*G11C 7/06*    (2006.01)

(52) U.S. Cl.
CPC .................. *G11C 7/22* (2013.01); *G11C 5/06* (2013.01); *G11C 7/062* (2013.01)

(58) Field of Classification Search
CPC .............. G11C 7/22; G11C 5/06; G11C 7/062
USPC ...................... 365/189.08, 196, 205
See application file for complete search history.

(56) References Cited

U.S. PATENT DOCUMENTS

| | | | |
|---|---|---|---|
| 4,375,600 A * | 3/1983 | Wu | G11C 11/34 327/387 |
| 5,475,642 A | 12/1995 | Taylor | |
| 5,621,680 A | 4/1997 | Newman | |
| 5,729,493 A | 3/1998 | Morton | |
| 6,028,791 A * | 2/2000 | Tanaka | G11C 7/062 365/185.2 |

(Continued)

*Primary Examiner* — Viet Q Nguyen
(74) *Attorney, Agent, or Firm* — Innovation Counsel LLP

(57) ABSTRACT

A memory device may include the following elements: a first memory cell; a first word line for transmitting a first control signal to control an electrical connection in the first memory cell; a first bit line connected to the first memory cell; a first transistor, wherein a first terminal of the first transistor is connected to the first bit line; a second memory cell; a second word line for transmitting a second control signal to control an electrical connection in the second memory cell; a second bit line connected to the second memory cell; a second transistor, wherein a first terminal of the second transistor is connected to the second bit line; and a sense amplifier having a first input terminal connected to a second terminal of the first transistor and having a second input terminal connected to a second terminal of the second transistor.

9 Claims, 5 Drawing Sheets

(56) References Cited

U.S. PATENT DOCUMENTS

| | | | |
|---|---|---|---|
| 6,188,608 B1* | 2/2001 | Maruyama | G11C 16/0416 365/185.2 |
| 6,297,985 B1 | 10/2001 | Kang | |
| 6,462,584 B1 | 10/2002 | Proebsting | |
| 6,574,135 B1 | 6/2003 | Komatsuzaki | |
| 6,580,298 B1 | 6/2003 | Subramanian | |
| 9,177,631 B2 | 11/2015 | Katoch | |
| 9,570,115 B2* | 2/2017 | Kwon | G11C 5/06 |
| 9,613,672 B2* | 4/2017 | Romanovskyy | G11C 11/1673 |
| 9,640,239 B2* | 5/2017 | Piccardi | G11C 11/1673 |
| 2002/0057622 A1 | 5/2002 | Sim | |
| 2003/0043621 A1* | 3/2003 | Wong | G11C 11/56 365/185.03 |
| 2003/0095457 A1 | 5/2003 | Jeon | |
| 2003/0099125 A1 | 5/2003 | Kang | |
| 2003/0142540 A1 | 7/2003 | Tanizaki | |
| 2003/0231525 A1 | 12/2003 | Mine | |
| 2005/0117429 A1* | 6/2005 | Lin | G11C 7/1039 365/222 |
| 2005/0254282 A1 | 11/2005 | Summerfelt | |
| 2005/0254294 A1* | 11/2005 | Iwata | G11C 11/14 365/171 |
| 2006/0092686 A1 | 5/2006 | Kang | |
| 2006/0239073 A1* | 10/2006 | Toda | G11C 11/5642 365/185.03 |
| 2007/0043984 A1 | 2/2007 | Mori | |
| 2007/0097768 A1 | 5/2007 | Barth, Jr. | |
| 2007/0223297 A1 | 9/2007 | Hirota | |
| 2007/0253274 A1 | 11/2007 | Miyamoto | |
| 2007/0263462 A1* | 11/2007 | Roohparvar | G11C 16/0483 365/198 |
| 2010/0265783 A1* | 10/2010 | Kern | G11C 7/062 365/210.1 |
| 2011/0026346 A1* | 2/2011 | La Rosa | G11C 7/065 365/207 |
| 2011/0194361 A1* | 8/2011 | Kawahara | G11C 11/16 365/189.09 |
| 2012/0008444 A1 | 1/2012 | Parris | |
| 2012/0044755 A1 | 2/2012 | Kim | |
| 2012/0069639 A1* | 3/2012 | Hoya | G11C 11/16 365/158 |
| 2012/0206986 A1 | 8/2012 | Wang | |
| 2013/0064008 A1* | 3/2013 | Kim | G11C 5/145 365/158 |
| 2013/0083615 A1 | 4/2013 | Choi | |
| 2013/0094277 A1* | 4/2013 | Rho | G11C 13/0026 365/148 |
| 2013/0272074 A1* | 10/2013 | Tanaka | G11C 16/3445 365/189.07 |
| 2015/0318043 A1* | 11/2015 | Chishti | G11C 17/18 365/185.21 |
| 2016/0027488 A1 | 1/2016 | Kim | |
| 2016/0049179 A1* | 2/2016 | La Rosa | G11C 7/08 365/189.05 |
| 2017/0162234 A1* | 6/2017 | Raghavan | G11C 7/062 |

* cited by examiner

MEMORY DEVICE, RELATED METHOD, AND RELATED ELECTRONIC DEVICE

CROSS-REFERENCE TO RELATED APPLICATION

This is a divisional of U.S. application Ser. No. 14/943,626 filed on Nov. 17, 2015, which application claims priority to and benefit of Chinese Patent Application No. 201410743255.7, filed on 8 Dec. 2014; the disclosures of which are incorporated herein by their reference.

BACKGROUND OF THE INVENTION

The present invention is related to a memory device, a method of operating the memory device, and an electronic device that includes the memory device.

A memory device may be included in an electronic device and may be configured to store data. A memory device may include a plurality of memory cells. A memory cell may include a transistor for controlling read and/or write of data, a word line for transmitting a control signal to the transistor, and a bit line for transmitting data.

SUMMARY

An embodiment of the present invention may be related to a memory device. The memory device may include the following elements: a first plurality of memory cells, which may include a first memory cell; a first word line, which may be electrically connected to each memory cell of the first plurality of memory cells and may transmit a first control signal for controlling electrical connections in the first plurality of memory cells; a first bit line, which may be electrically connected to the first memory cell; a first transistor, wherein a first terminal of the first transistor may be electrically connected to the first bit line; a second plurality of memory cells, which may include a second memory cell; a second word line, which may be electrically connected to each memory cell of the second plurality of memory cells and may transmit a second control signal for controlling electrical connections in the second plurality of memory cells; a second bit line, which may be electrically connected to the second memory cell; a second transistor, wherein a first terminal of the second transistor may be electrically connected to the second bit line; and a sense amplifier. A first input terminal of the sense amplifier may be electrically connected to a second terminal of the first transistor. The first transistor may control whether the first bit line may be electrically connected to the first input terminal of the sense amplifier. A second input terminal of the sense amplifier may be electrically connected to a second terminal of the second transistor. The second transistor may control whether the second bit line may be electrically connected to the second input terminal of the sense amplifier.

The first plurality of memory cells (or first memory cell set) may represent, for example, a first row, first column, first half, top bank, bottom bank, left bank, right bank, center portion, and/or non-center portion(s) of memory cells of the memory device. The second plurality of memory cells (or second memory cell set) may represent, for example, a second row, second column, second half, bottom bank, top bank, right bank, left bank, non-center portion(s), and/or center portion of memory cells of the memory device.

The memory device may include the following elements: a first source line, which may be electrically connected to the first memory cell; and a second source line, which may be electrically connected to the second memory cell. The first control signal may control whether the first bit line is electrically connected the first source line. The second control signal may control whether the second bit line is electrically connected the second source line.

The second word line may transmit no turn-on control signal whenever the first word line transmits any turn-on control signal.

The first memory cell may include a first cell transistor. A select gate terminal (SG) of the first cell transistor may be electrically connected to the first word line. A source terminal of the first cell transistor may be electrically connected to the first source line. A drain terminal of the first cell transistor may be electrically connected to the first bit line.

The second memory cell may include a second cell transistor. A select gate terminal (SG) of the second cell transistor may be electrically connected to the second word line. A source terminal of the second cell transistor may be electrically connected to the second source line. A drain terminal of the second cell transistor may be electrically connected to the second bit line.

The memory device may include a reference bias unit, a third transistor, and a fourth transistor. The reference bias unit may provide a reference bias signal. A first terminal of the third transistor may be electrically connected to the first bit line. A second terminal of the third transistor may be electrically connected to the reference bias unit. The third transistor may control whether the first bit line is electrically connected to the reference bias unit. A first terminal of the fourth transistor may be electrically connected to the second bit line. A second terminal of the fourth transistor may be electrically connected to the reference bias unit. The fourth transistor may control whether the second bit line is electrically connected to the reference bias unit.

The third transistor may be electrically connected to the first transistor. The third transistor and the first transistor may control whether the first input terminal of the sense amplifier is electrically connected to the reference bias unit. The fourth transistor may be electrically connected to the second transistor. The fourth transistor and the second transistor may control whether the second input terminal of the sense amplifier is electrically connected to the reference bias unit.

The first terminal of the third transistor may be electrically connected to the first terminal of the first transistor regardless of whether the first transistor is turned on and regardless of whether the third transistor is turned on. The first terminal of the fourth transistor may be electrically connected to the first terminal of the second transistor regardless of whether the second transistor is turned on and regardless of whether the fourth transistor is turned on.

The memory device may include a fifth transistor and a sixth transistor. A first terminal of the fifth transistor may be electrically connected to each of the first bit line and the first transistor. A second terminal of the fifth transistor may receive a first bit line bias signal. A first terminal of the sixth transistor may be electrically connected to each of the second bit line and the second transistor. A second terminal of the sixth transistor may receive a second bit line bias signal.

The first terminal of the fifth transistor may be electrically connected to the first terminal of the first transistor. The fifth transistor and the first transistor may control whether the first input terminal of the sense amplifier receives the first bit line bias signal. The first terminal of the sixth transistor may be electrically connected to the first terminal of the second transistor. The sixth transistor and the second transistor may control whether the second input terminal of the sense amplifier receives the second bit line bias signal.

The first terminal of the fifth transistor may be electrically connected to the first terminal of the first transistor regardless of whether the first transistor is turned on and regardless of whether the fifth transistor is turned on. The first terminal of the sixth transistor may be electrically connected to the first terminal of the second transistor regardless of whether the second transistor is turned on and regardless of whether the sixth transistor is turned on.

An embodiment of the present invention may be related to a method of operating a memory device. The method may include the following steps: providing a first turn-on control signal through a first word line to a first memory cell to enable a first bit line to be electrically connected to a first source line for transmitting a first data signal through the first bit line; turning on a first transistor to enable a first input terminal of a sense amplifier to receive the first data signal, wherein a first terminal of the first transistor may be electrically connected to the first bit line, and wherein a second terminal of the first transistor may be electrically connected to the first input terminal of the sense amplifier; when providing the first turn-on signal through the first word line, providing a first turn-off control signal through a second word line to a second memory cell for disabling an electrical connection between a second bit line and a second source line; and when turning on the first transistor, turning on a second transistor, wherein a first terminal of the second transistor may be electrically connected to the second bit line, and wherein a second terminal of the second transistor may be electrically connected to a second input terminal of the sense amplifier.

No turn-on control signal may be transmitted through the second word line whenever any turn-on control signal is transmitted through the first word line.

The method may include the following steps: when turning on the first transistor, turning off a third transistor; when turning on the second transistor, turning on a fourth transistor to enable the second input terminal of the sense amplifier to receive a first copy the reference bias signal and to enable a second copy of the reference bias signal to be transmitted to the second bit line; using the sense amplifier to compare the first data signal with the first copy of the reference bias signal for generating a comparison result; and providing the comparison result through an input/output unit. A first terminal of the third transistor may be electrically connected to each of the first bit line and the first transistor. A second terminal of the third transistor may be electrically connected to a reference bias unit. The reference bias unit may provide a reference bias signal. A first terminal of the fourth transistor may be electrically connected to each of the second bit line and the second transistor. A second terminal of the fourth transistor may be electrically connected to the reference bias unit.

The first terminal of the third transistor may be electrically connected to the first terminal of the first transistor regardless of whether the first transistor is turned on and regardless of whether the third transistor is turned on. The first terminal of the fourth transistor may be electrically connected to the first terminal of the second transistor regardless of whether the second transistor is turned on and regardless of whether the fourth transistor is turned on.

The method may include the following steps: when turning on the first transistor, turning off a fifth transistor to prevent the first input terminal of the sense amplifier from receiving a first bit line bias signal; and when turning on the second transistor, turning off a sixth transistor to prevent the second input terminal of the sense amplifier from receiving a second bit line bias signal. A first terminal of the fifth transistor may be electrically connected to each of the first bit line and the first transistor. A second terminal of the fifth transistor receives the first bit line bias signal. A first terminal of the sixth transistor may be electrically connected to each of the second bit line and the second transistor. A second terminal of the sixth transistor receives the second bit line bias signal.

The first terminal of the fifth transistor may be electrically connected to the first terminal of the first transistor regardless of whether the first transistor is turned on and regardless of whether the fifth transistor is turned on. The first terminal of the sixth transistor may be electrically connected to the first terminal of the second transistor regardless of whether the second transistor is turned on and regardless of whether the sixth transistor is turned on.

The method may include the following steps: providing a second turn-off control signal through the first word line to the first memory cell for disabling an electrical connection between the first bit line and the first source line; when providing the second turn-off control signal, providing a third turn-off control signal through the second word line to the second memory cell for disabling the electrical connection between the second bit line and the second source line; and when providing the second turn-off control signal, turning on the fifth transistor and turning on the sixth transistor.

The method may include the following step(s): when providing the second turn-off control signal, turning off the first transistor and turning off the second transistor.

The method may include the following step(s): when providing the second turn-off control signal, turning off the third transistor and turning off the fourth transistor.

A value of the first bit line bias signal may be equal to a value of the second bit line bias signal.

An embodiment of the present invention may be related to an electronic device. The electronic device may include an electronic component and a memory device. The memory device may be electrically connected to the electronic component. The memory device may have one or more of the aforementioned features.

According to embodiments of the present invention, a memory device may have a substantially simple structure. Advantageously, operation of the memory device may be substantially efficient, data output of the memory device may be substantially accurate, and/or the size of the memory device (and the size of the associated electronic device) may be substantially minimized.

The above summary is related to some of many embodiments of the invention disclosed herein and is not intended to limit the scope of the invention.

DETAILED DESCRIPTION

Figure 1:
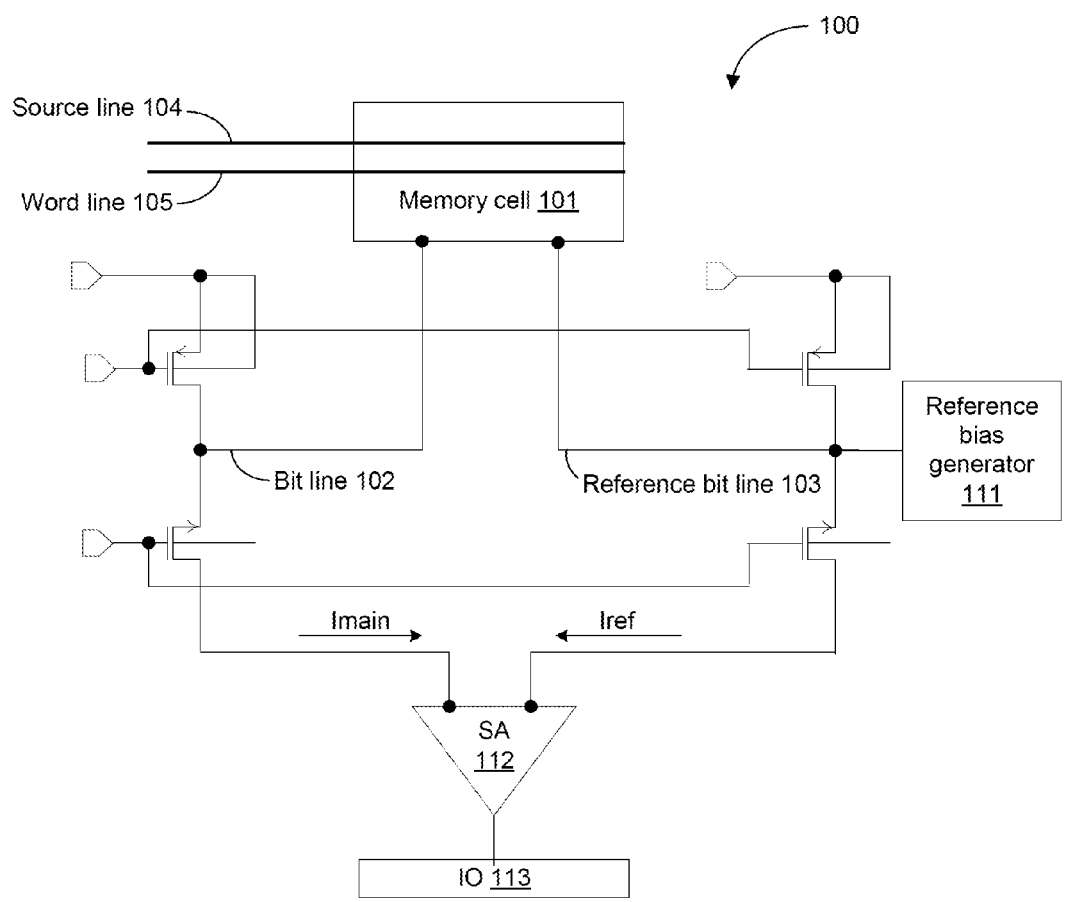
FIG. 1 shows a schematic diagram (e.g., a schematic circuit diagram) that illustrates elements, structures, and/or operation of a memory device in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "below," "lower," "under," "above," "upper" and the like, may be used herein for ease of description to describe the relationship of one element or feature to another element(s) or feature(s) as illustrated in the figures. The spatially relative terms may encompass different orientations of a device or structure in use or operation, in addition to the orientation(s) illustrated in the figures. For example, if a device or structure illustrated in a figure is turned over, elements described as "below" or "beneath" relative to other elements would then be positioned "above" relative to the other elements or features. Thus, the term "below" can encompass both a position of above and below. A device or structure may be otherwise oriented (e.g., rotated by 90 degrees or oriented at other orientations), and the spatially relative descriptors should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1 shows a schematic diagram (e.g., a schematic circuit diagram) that illustrates elements, structures, and/or operation of a memory device 100 in accordance with one or more embodiments of the present invention. The memory device 100 may include a memory cell array that includes a plurality of memory cells. The memory cells may include a memory cell 101. The memory device 100 may further include a bit line 102, a reference bit line 103, a source line 104, a word line 105, a reference bias generator 111, a sense amplifier 112, and an input/output unit 113. Each of the bit line 102, the reference bit line 103, the source line 104, and the word line 105 may be electrically connected to one or more transistors of the memory cell 101. The reference bias generator 111 may be electrically connected to the reference bit line 103 for providing a reference bias voltage to the bit line 103.

In a read operation of the memory device 100, the word line 105 may transmit an enabling signal (or turn-on signal) to the one or more transistor of the memory cell 101 to enable electrical connection between the bit line 102 and the source line 104 and to enable electrical connection between the reference bit line 103 and the source line 104. As a result, the bit line 102 may transmit a main signal Imain to the sense amplifier 112, and the reference bit line 103 may transmit a reference signal Iref to the sense amplifier 112. The sense amplifier 112 may compare the main signal Imain and the reference signal Iref and may provide the comparison result through the input/output unit 113.

Figure 2:
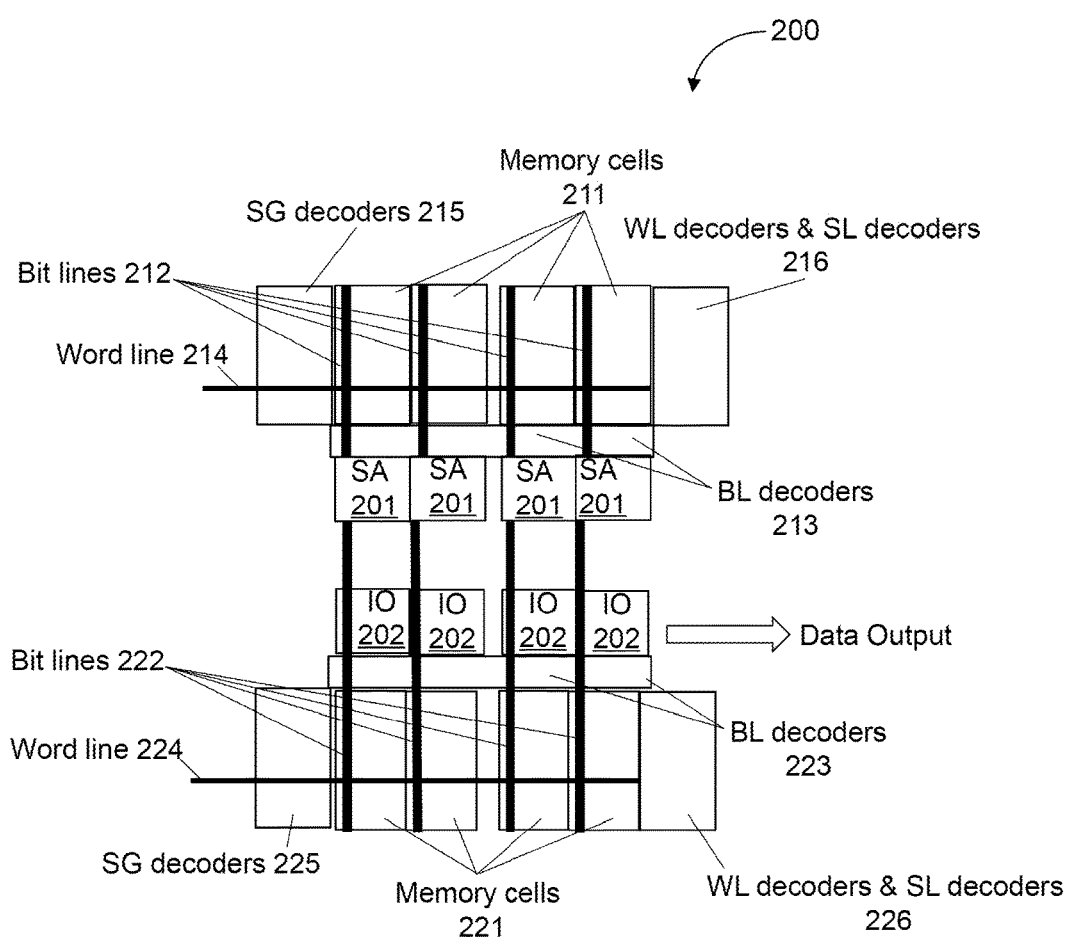
FIG. 2 shows a schematic diagram (e.g., a schematic block diagram) that illustrates elements, structures, and/or operation of a memory device in accordance with one or more embodiments of the present invention.
Figure 3:
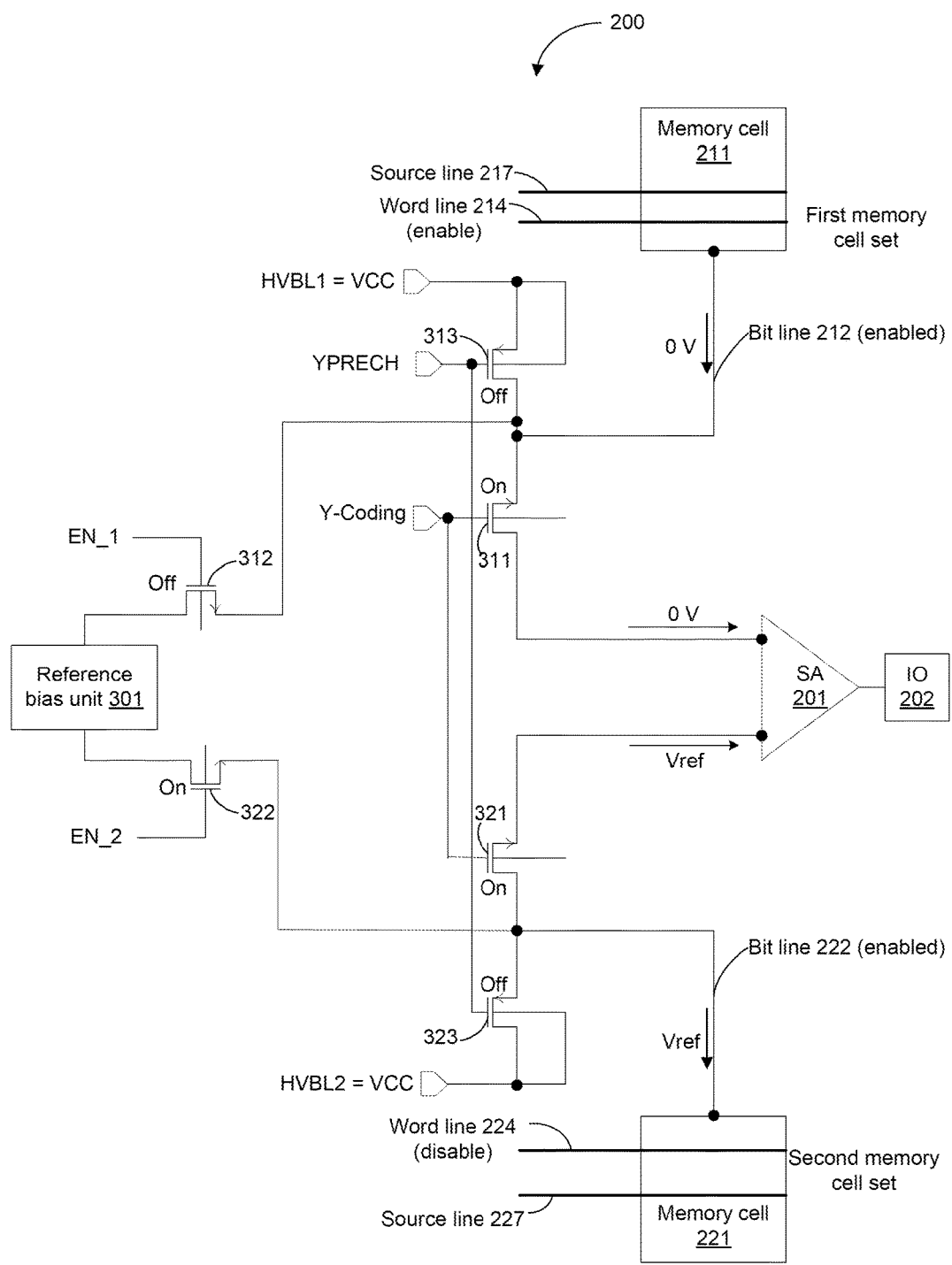
FIG. 3 shows a schematic diagram (e.g., a schematic circuit diagram) that illustrates elements, structures, and/or operation of a memory device in accordance with one or more embodiments of the present invention.
Figure 4:
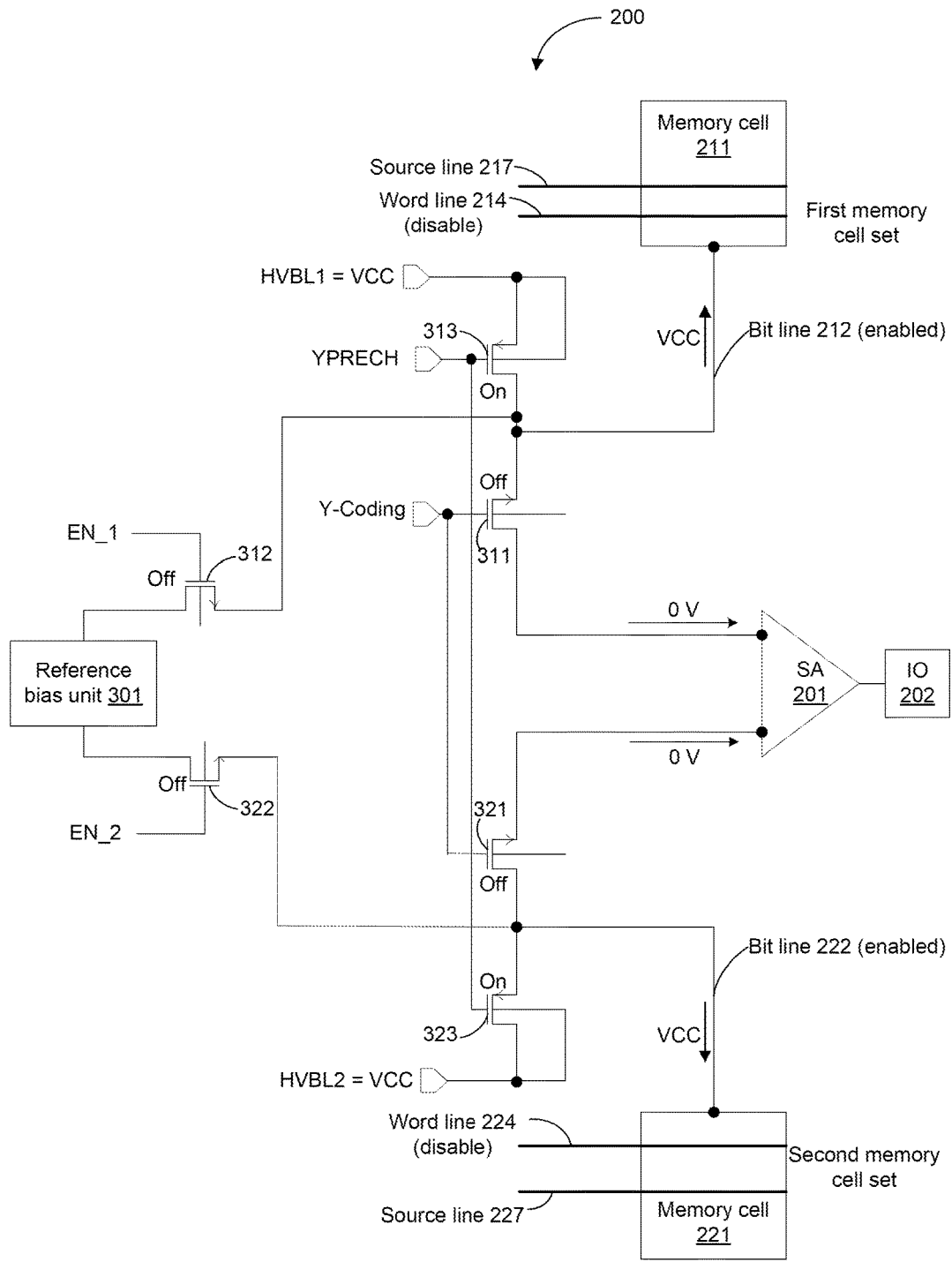
FIG. 4 shows a schematic diagram (e.g., a schematic circuit diagram) that illustrates elements, structures, and/or operation of a memory device in accordance with one or more embodiments of the present invention.

FIG. 2 shows a schematic diagram (e.g., a schematic block diagram) that illustrates elements, structures, and/or operation of a memory device 200 in accordance with one or more embodiments of the present invention. FIG. 3 shows a schematic diagram (e.g., a schematic circuit diagram) that illustrates elements, structures, and/or operation (e.g., a read operation) of the memory device 200 in accordance with one or more embodiments of the present invention. FIG. 4 shows a schematic diagram (e.g., a schematic circuit diagram) that illustrates elements, structures, and/or operation (e.g., a standby mode) of the memory device 200 in accordance with one or more embodiments of the present invention.

The memory device 200 may include the following elements: a first memory cell set, which may include a plurality of first-set memory cells 211, which may include a first memory cell 211; a first word line 214, which may be electrically connected to each memory cell of the first-set memory cells 211 and may transmit a first control signal for controlling electrical connections in the first-set memory cells 211; a first bit line 212, which may be one of first-set bit lines 212 and may be electrically connected to the first memory cell 211; and a first transistor 311, wherein a first terminal (e.g., drain terminal or source terminal) of the first transistor 311 may be electrically connected to the first bit line 212.

The memory device 200 may further include the following elements: a second memory cell set, which may include a plurality of second-set memory cells 221, which may include a second memory cell 221; a second word line 224, which may be electrically connected to each memory cell of the second-set memory cells 221 and may transmit a second control signal for controlling electrical connections in the second-set memory cells 221; a second bit line 222, which may be one of second-set bit lines 222 and may be electrically connected to the second memory cell 221; and a second transistor 321, wherein a first terminal (e.g., drain terminal or source terminal) of the second transistor 321 may be electrically connected to the second bit line 222.

The first memory cell set may represent, for example, a first group, first row, first column, first half, top bank, bottom bank, left bank, right bank, center portion, and/or non-center portion(s) of memory cells of the memory device 200. The second memory cell set may represent, for example, a second group, second row, second column, second half, bottom bank, top bank, right bank, left bank, non-center portion(s), and/or center portion of memory cells of the memory device 200.

The memory device 200 may include the following elements: a first source line 217, which may be electrically connected to the first memory cell 211; and a second source line 227, which may be electrically connected to the second memory cell 221. The first control signal may control whether the first bit line 212 is electrically connected the first source line 217. The second control signal may control whether the second bit line 222 is electrically connected the second source line 227.

The first memory cell 211 may include a first cell transistor. A select gate terminal (SG) of the first cell transistor may be electrically connected to the first word line 214. A source terminal of the first cell transistor may be electrically connected to the first source line 217. A drain terminal of the first cell transistor may be electrically connected to the first bit line 212.

The second memory cell 221 may include a second cell transistor. A select gate terminal (SG) of the second cell transistor may be electrically connected to the second word line 224. A source terminal of the second cell transistor may be electrically connected to the second source line 227. A drain terminal of the second cell transistor may be electrically connected to the second bit line 222.

The memory device 200 may include first-set select gate decoders 215 (or SG decoders 215), second-set select gate decoders 225 (or SG decoders 225), first-set word line decoders and first-set source line decoders 216 (or WL decoders & SL decoders 216), second-set word line decoders and first-set source line decoders 226 (or WL decoders & SL decoders 226), first-set bit line decoders 213 (or BL decoders 213), and second-set bit line decoders 223 (or BL decoders 223). The first-set memory cells 211 (e.g., the associated first word line 214, first-set select gates, and/or first source line 217) may be selected or unselected, enabled or disabled, and/or turned on or turned off using memory cell address and the decoders 215 and 216.

The first-set memory cells (e.g., the associated first word line 214, first-set select gates, and/or first source line 217) may be selected or unselected, enabled or disabled, and/or turned on or turned off using associated memory cell address and the decoders 215 and 216. The second-set memory cells 221 (e.g., the associated second word line 224, second-set select gates, and/or second source line 227) may be selected or unselected, enabled or disabled, and/or turned on or turned off using associated memory cell address and the decoders 225 and 226. The second word line 224 may transmit no turn-on control signal whenever the first word line 214 transmits any turn-on control signal. Bit lines (e.g., the bit lines 212 and 222) associated with both the first-set memory cells 211 and the second-set memory cells 221 may be enabled using the decoders 213 and 223.

The memory device 200 may include a plurality of sense amplifiers 201 (or SA 201) and a plurality of input/output units 202 (or IO 202). Each sense amplifier 201 may be associated with one first-set memory cell 211 and one second-set memory cell 221 and may be electrically connected to one input/output unit 202.

A first input terminal of a sense amplifier 201 may be electrically connected to a second terminal (e.g., source terminal or drain terminal) of the first transistor 311. The first transistor 311 may control whether the first bit line 212 may be electrically connected to the first input terminal of the sense amplifier 201. A second input terminal of the sense amplifier 201 may be electrically connected to a second terminal (e.g., source terminal or drain terminal) of the second transistor 321. The second transistor 321 may control whether the second bit line 222 may be electrically connected to the second input terminal of the sense amplifier 201.

Both of the first transistor 311 and the second transistor 321 may be controlled by a control signal Y-Coding. In an embodiment, each of the first transistor 311 and the second transistor 321 may be a p-type transistor, such as a p-type metal-oxide-semiconductor field-effect transistor (PMOS transistor). Both of the first transistor 311 and the second transistor 321 may be turned on when the control signal Y-Coding is a low voltage, e.g., ground voltage. Both of the first transistor 311 and the second transistor 321 may be turned off when the control signal Y-Coding is a high voltage, e.g., a positive voltage. In an embodiment, each of the first transistor 311 and the second transistor 321 may be an n-type transistor, such as an n-type metal-oxide-semiconductor field-effect transistor (NMOS transistor).

The memory device 200 may include a reference bias unit 301, a third transistor 312, and a fourth transistor 322. The reference bias unit 301 may provide a reference bias signal Vref. A first terminal of the third transistor 312 may be electrically connected to the first bit line 212. A second terminal of the third transistor 312 may be electrically connected to the reference bias unit 301. The third transistor 312 may control whether the first bit line 212 is electrically connected to the reference bias unit 301. A first terminal of the fourth transistor 322 may be electrically connected to the second bit line 222. A second terminal of the fourth transistor 322 may be electrically connected to the reference bias unit 301. The fourth transistor 322 may control whether the second bit line 222 is electrically connected to the reference bias unit 301.

The third transistor 312 may be electrically connected to the first transistor 311. The third transistor 312 and the first transistor 311 may control whether the first input terminal of the sense amplifier 201 is electrically connected to the reference bias unit 301. The fourth transistor 322 may be electrically connected to the second transistor 321. The fourth transistor 322 and the second transistor 321 may control whether the second input terminal of the sense amplifier 201 is electrically connected to the reference bias unit 301.

The first terminal of the third transistor 312 may be electrically connected to the first terminal of the first transistor 311 regardless of whether the first transistor 311 is turned on and regardless of whether the third transistor 312 is turned on. The first terminal of the fourth transistor 322 may be electrically connected to the first terminal of the second transistor 321 regardless of whether the second transistor 321 is turned on and regardless of whether the fourth transistor 322 is turned on.

The third transistor 312 may be controlled by a control signal EN_1. The fourth transistor 322 may be controlled by a control signal EN_2. In an embodiment, each of the third transistor 312 and the fourth transistor 322 may be a p-type transistor, such as a PMOS transistor. In an embodiment, each of the third transistor 312 and the fourth transistor 322 may be an n-type transistor, such as an NMOS transistor.

The memory device 200 may include a fifth transistor 313 and a sixth transistor 323. A first terminal of the fifth transistor 313 may be electrically connected to each of the first bit line 212 and the first transistor 311. A second terminal of the fifth transistor 313 may receive a first bit line bias signal HVBL1. A first terminal of the sixth transistor 323 may be electrically connected to each of the second bit line 222 and the second transistor 321. A second terminal of the sixth transistor 323 may receive a second bit line bias signal HVBL2.

The first terminal of the fifth transistor 313 may be electrically connected to the first terminal of the first transistor 311. The fifth transistor 313 and the first transistor 311 may control whether the first input terminal of the sense amplifier 201 receives the first bit line bias signal HVBL1. The first terminal of the sixth transistor 323 may be electrically connected to the first terminal of the second transistor 321. The sixth transistor 323 and the second transistor 321 may control whether the second input terminal of the sense amplifier 201 receives the second bit line bias signal HVBL2.

The value of the first bit line bias signal HVBL1 may be equal to the value of the second bit line bias signal HVBL2. Each of the first bit line bias signal HVBL1 and the second bit line bias signal HVBL2 may be a copy of a positive supply voltage VCC.

The first terminal of the fifth transistor 313 may be electrically connected to the first terminal of the first transistor 311 regardless of whether the first transistor 311 is turned on and regardless of whether the fifth transistor 313 is turned on. The first terminal of the sixth transistor 323 may be electrically connected to the first terminal of the second transistor 321 regardless of whether the second transistor 321 is turned on and regardless of whether the sixth transistor 323 is turned on.

Both of the fifth transistor 313 and the sixth transistor 323 may be controlled by a control signal YPRECH. In an embodiment, each of the fifth transistor 313 and the sixth transistor 323 may be a p-type transistor, such as a PMOS transistor. In an embodiment, each of the fifth transistor 313 and the sixth transistor 323 may be an n-type transistor, such as an NMOS transistor.

Referring to FIG. 3, a method associated with a read operation of the memory device 200 may include the following steps: providing a first turn-on control signal (i.e., an enabling signal) through the first word line 214 to the first memory cell 211 to enable the first bit line 212 to be electrically connected to the first source line 217, for transmitting a first data signal (e.g., 0 Volt) through the first bit line 212; when providing the first turn-on signal through the first word line 214, turning on the first transistor 311 to enable the first input terminal of the associated sense amplifier 201 to receive the first data signal (e.g., 0 Volt); when providing the first turn-on signal through the first word line 214, providing a first turn-off control signal (i.e., a disabling signal) through the second word line 224 to the second memory cell 221 for disabling an electrical connection between the second bit line 222 and the second source line 227; and when turning on the first transistor 311, turning on the second transistor 321.

No turn-on control signals (i.e., no enabling signals) may be transmitted through the second word line 224 whenever any turn-on control signal is transmitted through the first word line 214.

The method may include the following steps: when turning on the first transistor 311, turning off the fifth transistor 313 to prevent the first input terminal of the sense amplifier 201 from receiving the first bit line bias signal HVBL1; and when turning on the second transistor 321, turning off a sixth transistor 323 to prevent the second input terminal of the sense amplifier 201 from receiving the second bit line bias signal HVBL2.

The method may include the following steps: when turning on the first transistor 311, turning off the third transistor 312; when turning on the second transistor 321, turning on the fourth transistor 322 to enable the second input terminal of the sense amplifier 201 to receive a first copy the reference bias signal Vref and to enable a second copy of the reference bias signal Vref to be transmitted to the second bit line 222; using the sense amplifier 201 to compare the first data signal (e.g., 0 Volt received at the first input terminal) with the first copy of the reference bias signal Vref (received at the second input terminal) for generating a comparison result; and providing the comparison result through the associated input/output unit 202 as read data.

Referring FIG. 4, a method associated with a standby mode of the memory device 200 may include the following steps: providing a second turn-off control signal (i.e., a disabling signal) through the first word line 214 to the first memory cell 211 for disabling an electrical connection between the first bit line 212 and the first source line 217; when providing the second turn-off control signal through the first word line 214, providing a third turn-off control signal (i.e., a disabling signal) through the second word line 224 to the second memory cell 221 for disabling the electrical connection between the second bit line 222 and the second source line 227; and when providing the second turn-off control signal through the first word line 214, turning on the fifth transistor 313 and turning on the sixth transistor 323. The method may include the following step (s): when providing the second turn-off control signal, turning off the first transistor 311 and turning off the second transistor 321. The method may include the following step (s): when providing the second turn-off control signal, turning off the third transistor 312 and turning off the fourth transistor 322. As a result, the signals received at the two input terminals of the sense amplifier 201 may have the same value, and substantially no data may be read.

According to embodiments of the present invention, the memory device 200 may have a substantially simple structure. Advantageously, operation of the memory device 200 may be substantially efficient, data output of the memory device may be substantially accurate, and/or the size of the memory device 200 may be substantially minimized.

Figure 5:
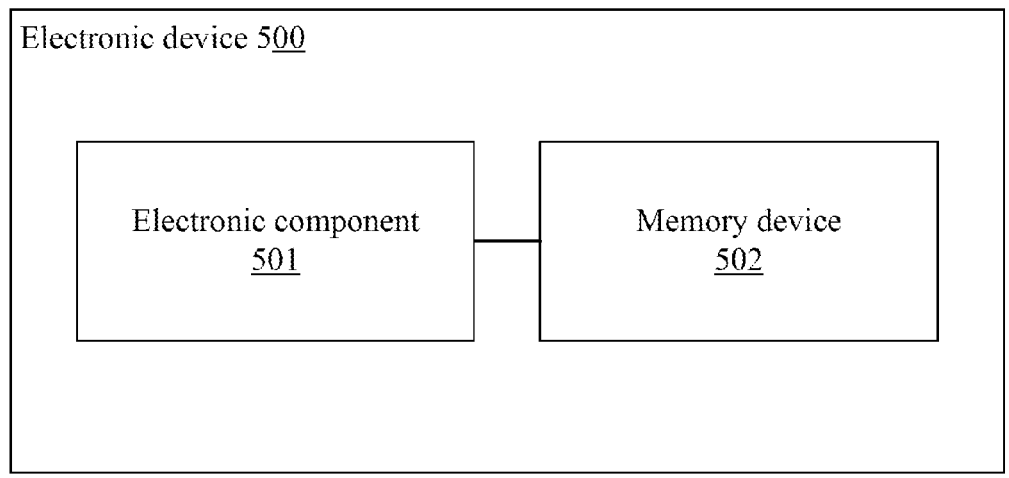
FIG. 5 shows a schematic block diagram that illustrates elements in an electronic device in accordance with one or more embodiments of the present invention.

FIG. 5 shows a schematic block diagram that illustrates elements in an electronic device 500 in accordance with one or more embodiments of the present invention. The electronic device 500 may include an electronic component 501 and a memory device 502 that is electrically connected to the electronic component 501. The memory device 502 may have one or more of the above-discussed features.

In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be or may include an intermediate product (e.g., a mobile phone main board) or module including a semiconductor device that may have one or more of the features and advantages discussed above.

According to embodiments of the present invention, a memory device may have a substantially simple structure. Advantageously, operation of the memory device may be substantially efficient, data output of the memory device may be substantially accurate, and/or the size of the memory device (and the size of the associated electronic device) may be substantially minimized.

While this invention has been described in terms of several embodiments, there are alterations, permutations, and equivalents, which fall within the scope of this invention. There are many alternative ways of implementing the methods and apparatuses of the present invention. Embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method of operating a memory device, the method comprising:

providing a first turn-on control signal through a first word line to a first memory cell to enable a first bit line to be electrically connected to a first source line for transmitting a first data signal through the first bit line;

turning on a first transistor to enable a first input terminal of a sense amplifier to receive the first data signal, wherein a first terminal of the first transistor is electrically connected to the first bit line, and wherein a second terminal of the first transistor is electrically connected to the first input terminal of the sense amplifier;

when providing the first turn-on signal through the first word line, providing a first turn-off control signal through a second word line to a second memory cell for disabling an electrical connection between a second bit line and a second source line; and when turning on the first transistor, turning on a second transistor, wherein a first terminal of the second transistor is electrically connected to the second bit line, and wherein a second terminal of the second transistor is electrically connected to a second input terminal of the sense amplifier.

2. The method of claim 1, comprising:

when turning on the first transistor, turning off a third transistor, wherein a first terminal of the third transistor is electrically connected to each of the first bit line and the first transistor, wherein a second terminal of the third transistor is electrically connected to a reference bias unit, and wherein the reference bias unit is configured to provide a reference bias signal;

when turning on the second transistor, turning on a fourth transistor to enable the second input terminal of the sense amplifier to receive a first copy the reference bias signal and to enable a second copy of the reference bias signal to be transmitted to the second bit line, wherein a first terminal of the fourth transistor is electrically connected to each of the second bit line and the second transistor, wherein a second terminal of the fourth transistor is electrically connected to the reference bias unit;

using the sense amplifier to compare the first data signal with the first copy of the reference bias signal for generating a comparison result; and providing the comparison result through an input/output unit.

3. The memory device of claim 2, wherein the first terminal of the third transistor is electrically connected to the first terminal of the first transistor regardless of whether the first transistor is turned on and regardless of whether the third transistor is turned on, and wherein the first terminal of the fourth transistor is electrically connected to the first terminal of the second transistor regardless of whether the second transistor is turned on and regardless of whether the fourth transistor is turned on.

4. The method of claim 2, comprising:
when turning on the first transistor, turning off a fifth transistor to prevent the first input terminal of the sense amplifier from receiving a first bit line bias signal, wherein a first terminal of the fifth transistor is electrically connected to each of the first bit line and the first transistor, wherein a second terminal of the fifth transistor receives the first bit line bias signal; and
when turning on the second transistor, turning off a sixth transistor to prevent the second input terminal of the sense amplifier from receiving a second bit line bias signal, wherein a first terminal of the sixth transistor is electrically connected to each of the second bit line and the second transistor, wherein a second terminal of the sixth transistor receives the second bit line bias signal.

5. The method of claim 4, wherein the first terminal of the fifth transistor is electrically connected to the first terminal of the first transistor regardless of whether the first transistor is turned on and regardless of whether the fifth transistor is turned on, and wherein the first terminal of the sixth transistor is electrically connected to the first terminal of the second transistor regardless of whether the second transistor is turned on and regardless of whether the sixth transistor is turned on.

6. The method of claim 4, comprising:
providing a second turn-off control signal through the first word line to the first memory cell for disabling an electrical connection between the first bit line and the first source line;
when providing the second turn-off control signal, providing a third turn-off control signal through the second word line to the second memory cell for disabling the electrical connection between the second bit line and the second source line; and
when providing the second turn-off control signal, turning on the fifth transistor and turning on the sixth transistor.

7. The method of claim 6, comprising:
when providing the second turn-off control signal, turning off the first transistor and turning off the second transistor.

8. The method of claim 6, comprising:
when providing the second turn-off control signal, turning off the third transistor and turning off the fourth transistor.

9. The method of claim 4, wherein a value of the first bit line bias signal is equal to a value of the second bit line bias signal.

* * * * *